United States Patent [19]  
Takeshita et al.

[11] Patent Number: 4,663,771  
[45] Date of Patent: May 5, 1987

[54] SOLID STATE IMAGE PICKUP DEVICE IN WHICH THE TRANSFER GATE AREAS ARE SUPPLIED WITH NEGATIVE VOLTAGE DURING THE VERTICAL TRANSFER PERIOD AND LIGHT RECEIVING PERIOD BUT NOT WHEN THE POSITIVE READOUT PULSE PERIOD IS APPLIED

[75] Inventors: Kaneyoshi Takeshita, Tokyo; Takeo Hashimoto, Machida, both of Japan

[73] Assignee: Sony Corporation, Tokyo, Japan

[21] Appl. No.: 818,060

[22] PCT Filed: Aug. 27, 1982

[86] PCT No.: PCT/JP82/00342  
§ 371 Date: Apr. 26, 1983  
§ 102(e) Date: Apr. 26, 1983

[87] PCT Pub. No.: WO83/00969  
PCT Pub. Date: Mar. 17, 1983

Related U.S. Application Data

[63] Continuation of Ser. No. 491,196, Apr. 26, 1983.

[30] Foreign Application Priority Data

Aug. 29, 1981 [JP] Japan .................... 56-135797

[51] Int. Cl.$^4$ .............. G11C 19/28; H01L 29/78; H01L 27/14; H01L 31/00
[52] U.S. Cl. .................... 377/58; 357/24; 357/30
[58] Field of Search ............... 357/24 LR, 30; 377/57–63; 307/311

[56] References Cited  
U.S. PATENT DOCUMENTS 3,866,067  2/1975  Amelio ........................... 357/24
3,931,465  1/1976  Levine ............................ 357/24
4,028,716  6/1977  van Santen et al. ........... 357/24 LR
4,322,753  3/1982  Ishihara ......................... 357/24 LR
4,447,735  5/1984  Horii ............................. 357/30
4,460,912  7/1984  Takeshita et al. ............. 357/24 LR
4,489,423  12/1984 Suzuki ........................... 357/24 LR
4,498,013  2/1985  Kuroda et al. ................. 357/24 LR
4,518,978  5/1985  Takeshita ....................... 357/24 LR Primary Examiner—Gene M. Munson  
Attorney, Agent, or Firm—Hill, Van Santen, Steadman & Simpson

[57] ABSTRACT

In an image pickup device comprising photodetectors (1), vertical transfer portions (2), transfer gate areas (3) each provided between one of the photodetectors (1) and the corresponding one of the vertical transfer portions (2), a storage portion (7), a horizontal transfer portion (5) and an output portion (6), the whole of which are formed on a semiconductor substrate, wherein signal charges obtained in the photodetectors (1) during a light receiving period are read out through the transfer gate areas (3) to the vertical transfer portions (2) during a reading out period, then transferred from the vertical transfer portions (2) to the storage portion (7) at high speed and further transferred through the horizontal transfer portion (5) to the output portion (6); the transfer gate areas (3) are of high impurity density, and each of the vertical transfer portions (2) is surrounded by a region (13) of high impurity density including the transfer gate areas. The transfer gate portions (3) and other portions in the region (13) of high impurity density positioned around each of the vertical transfer portions (2) are kept in an accumulation state during the operating period except for during the reading out period.

1 Claim, 4 Drawing Figures

SOLID STATE IMAGE PICKUP DEVICE IN WHICH THE TRANSFER GATE AREAS ARE SUPPLIED WITH NEGATIVE VOLTAGE DURING THE VERTICAL TRANSFER PERIOD AND LIGHT RECEIVING PERIOD BUT NOT WHEN THE POSITIVE READOUT PULSE PERIOD IS APPLIED

This is a continuation of application Ser. No. 491,196, filed Apr. 26, 1983.

TECHNICAL FIELD

This invention relates to solid state image pickup devices comprising a charge transfer device, and more particularly is directed to an improved solid state image pickup device of the interline transfer type, which can suppress deterioration of the quality of a picture obtained in response to an image pickup signal output therefrom, which are caused by the undesirable phenomena called "blooming" and "smear", without being provided with an overflow drain therein.

TECHNICAL BACKGROUND

Solid state image pickup device comprising a charge transfer device such as a charge coupled device (hereinafter referred to as a CCD) are classfied broadly into the frame transfer type and the interline transfer type, and there are advantages common to both types that they can be constructed as devices of small size and light weight and can be operative with low power consumption and with high reliability. Accordingly, the solid state image pickup devices comprising CCD image pickup devices are image pickup devices which are expected to be successful. However, previously proposed CCD image pickup devices have encountered several problems such as the undesirable phenomena called "blooming" and "smear".

There have been proposed some measures for reducing deterioration in the quality of a picture reproduced in response to an image pickup signal output from the CCD image pickup device, which are caused by the blooming and the smear. For example, it is considerably effective for reducing deterioration in the quality of the reproduced picture caused by the blooming to provide an overflow drain in the CCD image pickup device, which is operative to drain superfluous charges overflowing from photo-sensing elements contained during the device in a light receiving period. However, such an overflow drain provided in the CCD image pickup device would raise disadvantages such as the area of each photo-sensing element is reduced or the degree of integration of the photo-sensing elements is reduced, so that photo-sensitivity and image-resolvability of the device are degraded.

Accordingly, a CCD image pickup device which can suppress deteriorations in the quality of a picture obtained in response to an image pickup signal output therefrom caused by the blooming and the smear, has been proposed which have a photo-sensing and vertical transfer portion and a horizontal transfer portion, both of which are provided in the form similar to those employed in a CCD image pickup device of the interline transfer type. A storage portion provided in a form similar to that used in a CCD image pickup device of the frame transfer type between the photosensing and vertical transfer portion and the horizontal transfer portion, wherein signal charges in vertical transfer portions contained in the photo-sensing and vertical transfer portion are transferred to the storage portion at high speed and each of the vertical transfer portions which are vacant acts as the overflow drain during the light receiving period.

Such a solid state image pickup device developed from the CCD image pickup device of the interline transfer type is referred to as a solid state image pickup device of the hybrid type hereinafter. In the solid state image pickup device of the hybrid transfer type, signal charges read out to the vertical transfer portions from photodetectors contained also in the photo-sensing and vertical transfer portion are transferred to the storage portion at high speed, and the signal charges transferred to the storage portion are further transferred to the horizontal transfer portion from the storage portion in turn during every period corresponding to a horizontal blanking period. Each of the vertical transfer portions, from which the signal charges have been transferred to the storage period so as to vacate them, acts as the overflow drain for excessive charges overflowing from the photodetectors and needless charges leaking into the vertical transfer portions, during the light receiving period. Then, prior to a read out period, in which the signal charges stored in the photodetectors are read out to the vertical transfer portions, which occur after the light receiving period, unnecessary charges remaining in the vertical transfer portions are transferred or swept out. Consequently, the signal charges transferred to the storage portion from the vertical transfer portions are prevented from containing unnecessary charges, and further, since the charge transfer of the signal charges to the storage portion in the vertical transfer portions is carried out at high speed within a relatively short period, undesirable charges will not leak into the signal charges during the period in which the signal charges are transferred to the storage portion and are reduced. As a result of, an image pickup signal output, with which a reproduced picture can be obtained with less deterioration in the quality caused due to the blooming and the smear, can be obtained by the solid state image pickup device of the hybrid transfer type.

However, in such a device of the hybrid transfer type as described above, the charge transfer for sweeping out the unnecessary charges in the vertical transfer portions is required to be performed in the direction opposite to the direction of the charge transfer of the signal charges to the storage portion and this results in the disadvantage that the configuration of the driving mechanism for causing the vertical transfer portions and the storage portion to perform the charge transfers becomes complicated. In addition, it is also required for the photodetectors and the vertical transfer portions to have superfluous charge capacity for handling the excessive charges during the period in which the charge transfer is performed in the vertical transfer portions and this results in another disadvantage in that only a portion, for example, less than fifty percents of the maximum charge which can be handled by the device can be used as the signal charges.

Accordingly, it is an object of the present invention to provide a novel solid state image pickup device formed in the hybrid transfer type so as to have the advantages generally incidental to a device of the hybrid transfer type and which is improved in configuration and operation so that the charge transfer at high speed for sweeping out unnecessary charges, which is done in the previously proposed device of the hybrid transfer type, is not required to be performed and therefore the configuration of the driving mechanism for causing vertical transfer and storage transfers is simplified, and the signal charge capacity thereof is increased and therefore and dynamic range of an image pickup signal output is increased.

DISCLOSURE OF THE INVENTION

According to an aspect of the present invention, a solid state image pickup device having photodetectors, vertical transfer portions, transfer gate areas, a storage portion, a horizontal transfer portion and an output portion in the same manner as a solid state image pickup device of the hybrid transfer type, is provided with a region of high impurity density which includes the transfer gate areas and surrounds each of the vertical transfer portions, and is arranged so that the transfer gate area and other portions positioned around each of the vertical transfer portions are kept in an accumulation state during the operating period except for during the read out period during which signal charges obtained in the photodetectors are read out to the vertical transfer portions through the transfer gate areas, so as to prevent excessive charges arising in the photodetectors from overflowing into the vertical transfer portions. The solid state image pickup device of the present invention can effectively suppress deteriorations in the quality of a picture obtained in response to an image pickup signal output therefrom, which are caused by blooming and smear, without being provided with an overflow drain, and can operate with high photo-sensitivity and with high image-resolvability. Further, in the device according to the present invention, since the charge transfer at high speed for sweeping out unnecessary charges is not required to be performed, a driving mechanism for causing the vertical transfer portions and the storage portion to perform the charge transfers can be simplified. Additionally since excessive charges and needless charges flowing into the vertical transfer portions are greatly reduced, the signal charge capacity of the photodetectors and the vertical transfer portions can be increased so that an image pickup signal output with enlarged dynamic range is obtained.

EMBODIMENTS MOST PREFERABLE FOR WORKING OF THE INVENTION

Preferred embodiments of the invention will be described in detail with reference to the drawings hereinafter.

Figure 1:
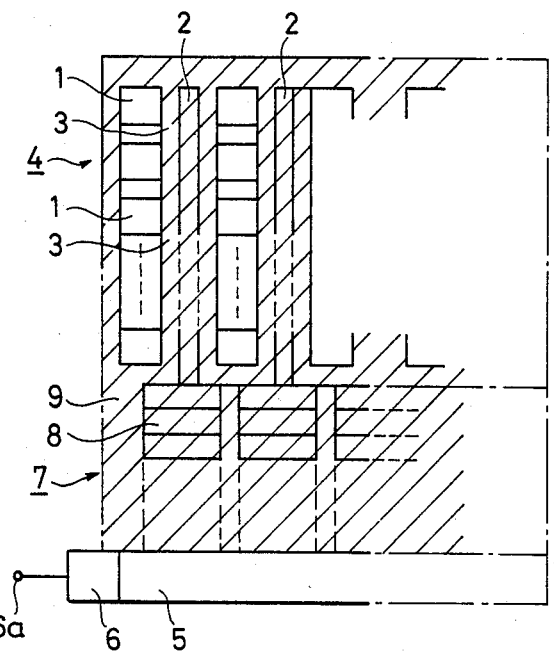
FIG. 1 is a schematic plan view showing one example of a solid state image pickup device according to the present invention.

FIG. 1 shows one example of a solid state image pickup device according to the present invention. This example comprises a photo-sensing and vertical transfer portion 4 which includes a plurality of photodetectors 1 arranged in horizontal and vertical rows and vertical transfer portions 2 each formed with, for example, a group of CCDs and extending along each of the vertical rows of the photodetectors 1, and is provided with transfer gate areas 3 each positioned between each of the vertical rows of photodetectors 1 and the corresponding one of the vertical transfer portion 2. A horizontal transfer portion 5 is formed with, for example, another group of CCDs, an output portion 6 coupled with the horizontal transfer portion 5, and a storage portion 7 formed with a further group of CCDs and provided between the photo-sensing and vertical transfer portion 4 and the horizontal transfer portion 5, the whole of which are formed on a semiconductor substrate. The storage portion 7 is connected to one end of each of the vertical transfer portions 2 and contains a plurality of horizontal rows 8 of storing and transfer areas of the same number as the number of horizontal rows of the photodetectors 1. Further, a signal output terminal 6a is provided for the output portion 6. These portions and areas except each vertical row of the photodetectors 1 are covered by a shading layer 9. Predetermined vertical transfer clock signals are applied to the vertical transfer portions 2 and the storage portion 7, respectively, and a predetermined horizontal transfer clock signal is applied to the horizontal transfer portion 5, so that charge transfer operations are achieved in the respective portions. For example, signal charges obtained at the photodetectors 1 in response to the light received thereby for one field period are read out to the vertical transfer portions 2 according to a reading pulse signal applied to the transfer gate areas 3 and then transferred from the vertical transfer portions 2 to the storage portion 7 at high speed, so that the signal charges produced in each horizontal row of the photodetectors 1 are transferred to the corresponding one of the horizontal rows 9 of the storing and transfer areas in the storage portion 7. The signal charges transferred to each one of the horizontal rows 9 of the storing and transfer areas in the storage portion 7 are transferred in turn to the horizontal transfer portion 5 during each period corresponding to a horizontal blanking period, and then transferred to the output portion 6 during a period corresponding to a horizontal video period and as a result an image pickup signal output is obtained at the output terminal 6a.

Figure 2:
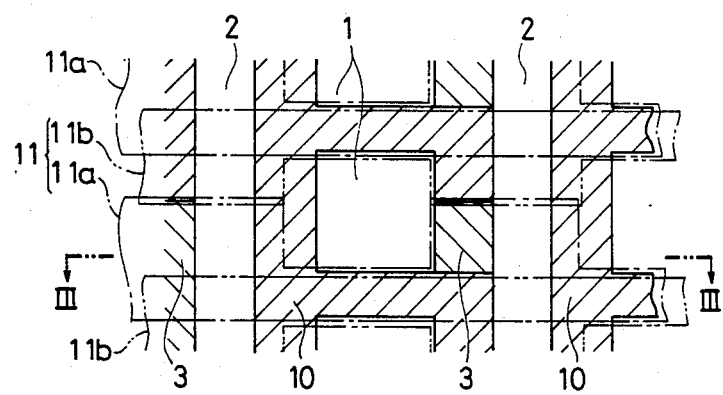
FIG. 2 is a plan view showing an enlarged portion of the example shown in FIG. 1.

In more detail, the photo-sensing and vertical transfer portion 4 mentioned above is provided with the transfer gate areas 3 between each vertical row of the photodetectors 1 and the corresponding one of the vertical transfer portions 2 and with channel stop areas 10 at the position contiguous to the photodetectors 1 on the side opposite to the transfer gate areas 3 and between each two adjacent photodetectors 1, as shown in FIG. 2. On each horizontal row of pickup units which contain one of the photodetectors 1, one of the vertical transfer electrodes 11 which extend horizontally is provided. Each of the vertical transfer electrodes 11 is extended to cover the transfer gate areas 3 so as to form transfer gate electrodes at portions thereof, and is composed of a charge storing electrode 11a and a potential barrier electrode 11b. The reading pulse signal is supplied in turn to these vertical transfer electrodes, and one and the other of two-phase vertical transfer clock signals are supplied to the respective groups of every other vertical transfer electrodes 11, respectively.

Figure 3:
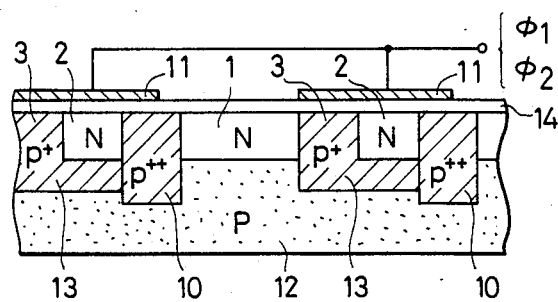
FIG. 3 shows a sectional view of a portion indicated by arrows III—III in FIG. 2.

The distinctive features in configuration of the device according to the present invention can be seen in FIG. 3 which shows a sectional view of the portion indicated by arrows III—III in FIG. 2. In FIG. 3, the photodetectors 1 and vertical transfer portions 2 are provided in the form of semiconductor regions of N type in a semiconductor substrate 12 of, for example, P type. Each of the vertical transfer portions 2 is formed with a group of buried channel CCDs and surrounded by a P type semiconductor region 13 having high impurity density and including the transfer gate areas 3 and a P type semiconductor region having high impurity density and forming the channel stop areas 10. An insulating layer 14 is provided on the whole of these portions and regions, and on the insulating layer 14. The vertical transfer electrodes 11 including the transfer gate electrodes are provided over the respective vertical transfer portions 2 and the respective transfer gate areas 3, respectively.

Figure 4:
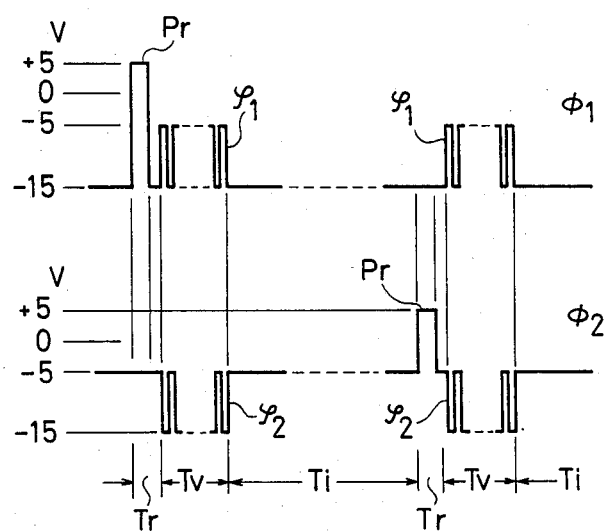
FIG. 4 is a waveform diagram showing examples of driving signals used for a solid state image pickup device according to the present invention.

In the example of the device according to the present invention thus constituted, for example, a driving signal $\Phi_1$ as shown in FIG. 4 is supplied to every other vertical transfer electrodes 11 and a driving signal $\Phi_2$ as shown in FIG. 4 is also supplied to alternate vertical transfer electrodes 11. The driving signal $\Phi_1$ contains a read pulse signal $P_r$ at every other reading out period $T_r$ and a vertical transfer clock signal $\phi_1$ during each vertical transfer period $T_v$, and takes a negative level, for example, $-15$ V during each light receiving period. The driving signal $\Phi_2$ contains the read pulse signal $P_r$ at another alternate read out period $T_r$ and a vertical transfer clock signal $\phi_2$, which is opposite in phase to the vertical transfer clock signal $\phi_1$, during each vertical transfer period $T_v$, and takes a negative level, the absolute value of which is smaller than that of the driving signal $\Phi_1$, for example, $-5$ V during each light receiving period. The read pulse signal $P_r$ takes a positive level, for example, $+5$ V and the vertical transfer clock signals $\phi_1$ and $\phi_2$ which are opposite in phase to each other are formed in negative pulse trains taking its high level at, for example, $-5$ V and its low level at, for example, $-15$ V.

Now, the operation of the example aforementioned will be explained hereinafter.

During the read out period $T_r$ in which the read pulse signal $P_r$ in the driving signals $\phi_1$ or $\phi_2$ is supplied to the vertical transfer electrode 11, the potential of the transfer gate areas 3 becomes high (deep) and consequently signal charges stored in the photodetectors 1 are read out through the transfer gate areas 3 to the vertical transfer portions 2. Next, during the vertical transfer period $T_v$, the vertical transfer clock signal $\phi_1$ is supplied to every other vertical transfer electrodes 11 and the vertical transfer clock signal $\phi_2$ is supplied to another every other vertical transfer electrodes 11, so that the signal charges read out from the photodetectors 1 are transferred to the storage portion 7 at high speed. Then, during the light receiving period $T_i$ following the vertical transfer period $T_v$, the vertical transfer electrodes 11 are supplied with the negative voltages ($-15$ V and $-5$ V) of the driving signals $\Phi_1$ and $\Phi_2$ and the photodetectors 1 produce and store signal charges in response to the amount of the light received thereby. After that, the read out period $T_r$ follows again and each step of the above mentioned operation is performed repeatedly.

In this operation, the transfer gate areas 3 formed into the P type semiconductor region having high impurity density are supplied with the negative voltage ($-5$ V or $-15$ V) during the vertical transfer period $T_v$ and the light receiving period $T_i$, other than the reading out period $T_r$ in which the transfer gate areas 3 are supplied with the read pulse signal $P_r$ taking the positive voltage ($+5$ V), and consequently are kept in an accumulation state in which holes are stored therein during the vertical transfer period $T_v$ and the light receiving period $T_i$. Accordingly, excessive charges produced in response to the light excessively entering in the photodetectors 1 during the light receiving period $T_i$ are diffused to the semiconductor substrate 12 because the hole density in the P type semiconductor regions 13 including the transfer gate areas 3 kept in an accumulation state and positioned around the respective vertical transfer portions 2 is higher than that in the semiconductor substrate 12, so that the excessive charges barely flow into the vertical transfer portions 2. Supposing the impurity density in the semiconductor substrate 12 is P, for example, $5 \times 10^{14}$ cm$^{-3}$ and the impurity density in the P type semiconductor region 13 is P$^+$, for example, $2 \times 10^{16}$ cm$^{-3}$, the ratio of the charges flowing into the vertical transfer portions 2 to the charges moving to the vertical transfer portions 2 is represented by P/P$^+$, for example, 1/40. As a result, it is achieved to reduce effectively the excessive charges flowing into the vertical transfer portions 2 without providing an overflow drain and it is not required to perform charge transfer for sweeping out unnecessary charges remaining in the vertical transfer portions 2 before the signal charges stored in the photodetectors 1 during the light receiving period $T_i$ are read out to the vertical transfer portions 2. The vertical transfer portions 2 are covered by the shading layer and therefore the light of course does not enter into the vertical transfer portions 2 directly.

In addition, during the light receiving period $T_i$, the areas corresponding to the respective photodetectors 1 of the vertical transfer portions 2 are alternately supplied with the negative voltages having their absolute values which are different from each other, for example, $-15$ V and $-5$ V as fixed bias voltages, so that the charge transfer operation is not performed in the vertical transfer portions 2 and, since the areas of low (shallow) potential and the areas of the high (deep) potential are arranged alternately in each of the vertical transfer portions 2, the small amount of charges which flow undesirably into the vertical transfer portions 2 are not moved therein but are stored at the respective areas into which the charges have undesirably flowed. Consequently, the blooming by which a picture obtained in response to an image pickup signal output is deteriorated in quality is suppressed. The blooming would be caused in such a case because the areas of high (deep) potential in the vertical transfer portions 2 are saturated by the charges flowing undesirably into the vertical transfer portions 2 during the light receiving period $T_i$. Supposing that the amount of the excessive charges produced in response to the light entering excessively to the photodetectors 1 is $I_o$, the ratio of a part of the excessive charges flowing toward a rear surface of the semiconductor substrate 12 in the side opposite to the photodetectors 1 to the whole excessive charges is $\alpha$, a part of the excessive charges flowing into the vertical transfer portions 2, which is referred to as $I_o'$, is represented by $(1-\alpha) \cdot (p/p^+) \cdot I_o$. Also, further supposing P/P$^+ = 1/40$ as mentioned above and $\alpha = 0.8$, $I_o'$ is obtained as $1/200 \cdot I_o$. Accordingly, in this case, the blooming is suppressed effectively as far as the amount of the light entering into the photodetectors 1 is less than two hundreds times as much as the amount of the light producing the charges which flow undesirably into the vertical transfer portions 2 and by which the areas of high potential in the vertical transfer portions 2 are saturated.

Further, during the vertical transfer period $T_v$, the transfer gate areas 3 are supplied with negative voltage so as to be kept in the accumulation state and the P type semiconductor regions 13 are operative in the same manner as during the light receiving period $T_i$, so that the charges flowing undesirably into the vertical transfer portions 2 are extremely reduced. Therefore, the smear which is caused due to the vertical transfer of the charges flowing undesirably into the vertical transfer portions 2 and which induces undesirable white stripes on a picture obtained in response to an image pickup signal output, is effectively suppressed.

Moreover, since it is not required for the photodetectors 1 and the vertical transfer portions 2 to have superfluous charge capacity for handling the excessive charges, the whole charge capacity of the photodetectors 1 and the vertical transfer portions 2 can be utilised for the signal charges, and therefore the dynamic range of an image pickup signal output can be enlarged or the driving signals supplied for causing the charge transfers can be reduced in amplitude so as to lighten the burden for a driving circuit arrangement.

Incidentally, since the vertical transfer portions 2 are formed with the buried channel CCDs in the above described example, the signal charges are transferred very effectively in the vertical transfer portions 2 during the vertical transfer period $T_v$.

It is to be understood that the solid state image pickup device according to the present invention is not limited to the embodiment described above, and that various changes and modifications may be effected thereto without departing from the scope or spirit of the invention.

Applicability for Industrial Use

As described above, the solid state image pickup device according to the present invention can produce an image pickup signal output which is superior in quality, in which the blooming and the smear are effectively suppressed, with a simplified driving mechanism for causing the device to perform charge transfer therein, and therefore is quite suitable for use in a high-grade television camera miniaturized in size and lightened in weight.

We claim:

1. A solid state image pickup device comprising photodetectors, vertical transfer portions, vertical transfer gate areas each provided between one of said photodetectors and the corresponding one of said vertical transfer portions, a storage portion, a horizontal transfer portion, an output portion, and a region of a first impurity density including said transfer gate areas and surrounding each of said vertical transfer gate areas and surrounding each of said vertical transfer portions, wherein signal charges obtained in said photodetectors during a light receiving period are read out through said transfer gate areas to said vertical transfer portions during a reading out period, then transferred from said vertical transfer portions to said storage portion at high speed and further transferred through said horizontal transfer portion in said output portion, and means for applying signals to said transfer gate areas and other portions in said region of first impurity density positioned around each of said vertical transfer portions to maintain them in a state so that they can accumulate charges during the operating period except during the reading out period to obtain a high quality video signal without the need for an overflow drain in said image pickup device and wherein said transfer gate areas are supplied with negative voltage during the vertical transfer period $T_v$ when charges are vertically transferred and the light receiving period but not during times when a positive read out pulse $P_r$ is applied to said transfer gate areas.

* * * * *